(12) United States Patent
Ueno et al.

(10) Patent No.: US 8,604,581 B2
(45) Date of Patent: Dec. 10, 2013

(54) SOLID-STATE IMAGE PICKUP DEVICE

(75) Inventors: Risako Ueno, Tokyo (JP); Hideyuki Funaki, Tokyo (JP); Yoshinori Iida, Tokyo (JP); Hiroto Honda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 980 days.

(21) Appl. No.: 12/211,427

(22) Filed: Sep. 16, 2008

(65) Prior Publication Data

US 2009/0242951 A1 Oct. 1, 2009

(30) Foreign Application Priority Data

Mar. 25, 2008 (JP) .................... 2008-078228

(51) Int. Cl.
*H01L 27/146* (2006.01)
(52) U.S. Cl.
USPC ............ 257/444; 257/292; 257/291; 257/290
(58) Field of Classification Search
USPC ............ 257/292, 228, 437, E31.08, 431, 432, 257/436, 443, 444, 447, 452, 458, 460, 257/466; 438/75
See application file for complete search history.

(56) References Cited

U.S. PATENT DOCUMENTS

| | | | |
|---|---|---|---|
| 6,177,711 B1 * | 1/2001 | Kariya ............................ 257/458 |
| 6,518,640 B2 | 2/2003 | Suzuki et al. | |
| 6,821,809 B2 | 11/2004 | Abe et al. | |
| 7,253,399 B2 * | 8/2007 | Sakoh et al. ................... 250/239 |
| 7,372,631 B2 * | 5/2008 | Ozawa ........................... 359/619 |
| 7,525,733 B2 * | 4/2009 | Ozawa ........................... 359/626 |
| 7,560,681 B2 * | 7/2009 | Moon et al. ................. 250/208.1 |
| 7,615,808 B2 * | 11/2009 | Pain et al. ...................... 257/228 |
| 7,847,852 B2 * | 12/2010 | Kuriyama ...................... 348/335 |
| 2005/0045927 A1 * | 3/2005 | Li ................................... 257/294 |
| 2008/0170149 A1 | 7/2008 | Iida et al. | |

FOREIGN PATENT DOCUMENTS

| | | |
|---|---|---|
| JP | 06-077518 A | 3/1994 |
| JP | 07-202149 A | 8/1995 |
| JP | 08-316506 A | 11/1996 |
| JP | 2002-280532 | 9/2002 |
| JP | 2004-144841 | 5/2004 |
| JP | 2005-057024 | 3/2005 |
| JP | 2005-268643 | 9/2005 |

(Continued)

OTHER PUBLICATIONS

Japanese Office Action issued on May 11, 2012 with an English translation.

(Continued)

*Primary Examiner* — Andy Huynh
*Assistant Examiner* — Sitaramarao S Yechuri
(74) *Attorney, Agent, or Firm* — Oblon, Spivak, McClelland, Maier & Neustadt, L.L.P.

(57) ABSTRACT

A solid-state image pickup device has a photoelectric conversion element that converts light incident from a first surface of a substrate into a signal charge and accumulates the signal charge, a transistor that is formed on a second surface side opposite to the first surface of the substrate and reads out the signal charge accumulated by the photoelectric conversion element, a supporting substrate stuck to the second surface of the substrate, and an antireflection coating formed on the first surface of the substrate, wherein the first surface of the substrate includes a curved surface or an inclined surface forming a prescribed angle to the second surface.

13 Claims, 7 Drawing Sheets

(56) References Cited

FOREIGN PATENT DOCUMENTS

| JP | 2006-49721 | 2/2006 |
|----|------------|--------|
| JP | 2006-528424 | 12/2006 |
| JP | 2007-173746 | 7/2007 |
| JP | 2007-288164 | 11/2007 |
| WO | 2007/097062 A1 | 8/2007 |

OTHER PUBLICATIONS

Japanese Office Action issued on Oct. 26, 2012 for Japanese Applicatin No. 2008-078228.

* cited by examiner $\theta1 < \theta2 < \theta3$

SOLID-STATE IMAGE PICKUP DEVICE

CROSS REFERENCE TO RELATED APPLICATION

This application is based upon and claims benefit of priority from the Japanese Patent Application No. 2008-78228, filed on Mar. 25, 2008, the entire contents of which are incorporated herein by reference.

BACKGROUND OF THE INVENTION

The present invention relates to a solid-state image pickup device.

In conventional CMOS image sensors, a plurality of photoelectric conversion parts (photodiodes) that become pixels are formed in a matrix manner in a front surface portion of a semiconductor substrate, and light is radiated (caused to become incident) to the photodiodes by being caused to pass through the gaps of interconnect layers, whereby the light is detected. However, because the aperture size of a photodiode with respect to a surface of incidence of light is limited by the presence of the interconnect layers, with the pitch of pixels miniaturized, it has been difficult to obtain sufficient utilization efficiencies of incident light.

There has been proposed a technique that involves providing microlenses on an interconnect layer in units of pixels and increasing sensitivity by collecting light on a photodiode via openings of the interconnect layer. However, with the trends toward high integration and scaledown of semiconductor devices growing stronger, it has become difficult to obtain sufficient sensitivity even by using microlenses.

To solve such problems, there has been proposed a back side radiation type image sensor which is such that a photodiode is irradiated with light from the back surface side (the side opposite to an interconnect layer) and high sensitivity is obtained by increasing the effective aperture ratio without the influence of the presence of the interconnect layer and the like.

Light that has passed through a color filter that allows light of a specific wavelength to pass is caused to become incident on the photodiode. In the color filter, three colors, for example, R (red), G (green) and B (blue) constitute one set. A ray of red light of long wavelength has a small absorption coefficient in single-crystal silicon compared to a ray of blue light of short wavelength and has a long penetration length. For this reason, light that has not been absorbed by a pixel for red color reaches a green pixel and a blue pixel, which are adjacent to the red pixel, thereby posing the problem of what is called mixing of colors in which a wrong color signal is given.

Mixing of colors is apt to occur in a peripheral part of a pixel matrix region having a large incident angle of light on a pixel. This mixing of colors is more highlighted in the back side radiation type with high aperture ratio capable of taking incident light in from the whole surface of a pixel. Also, in the back side radiation type, light (that has not been absorbed in Si) reflected from the interconnect layer positioned below the photodiode penetrates into an adjacent pixel and this may cause mixing of colors.

As described above, conventional back side radiation type image sensors as described above had the problem that mixing of colors is apt to occur.

SUMMARY OF THE INVENTION

According to one aspect of the present invention, there is provided a solid-state image pickup device, comprising:

a photoelectric conversion element that converts light incident from a first surface of a substrate into a signal charge and accumulates the signal charge;

a transistor that is formed on a second surface side opposite to the first surface of the substrate and reads out the signal charge accumulated by the photoelectric conversion element;

a supporting substrate stuck to the second surface of the substrate; and an antireflection coating formed on the first surface of the substrate, wherein the first surface of the substrate includes a curved surface or an inclined surface forming a prescribed angle to the second surface.

According to one aspect of the present invention, there is provided a solid-state image pickup device, comprising:

a photoelectric conversion element that converts light incident from a first surface of a substrate into a signal charge and accumulates the signal charge;

a transistor that is formed on a second surface side opposite to the first surface of the substrate and reads out the signal charge accumulated by the photoelectric conversion element;

a supporting substrate stuck to the second surface of the substrate;

an antireflection coating formed on the first surface of the substrate;

a transparent planarization film formed on the antireflection coating;

a color filter formed on the transparent planarization film; and a collecting part that is formed on the color filter and made of transparent resin and whose surface profile includes a convex shape and a concave shape.

DESCRIPTION OF THE EMBODIMENTS

A solid-state image pickup device in an embodiment of the present invention will be described below on the basis of the drawings.

Figure 1:
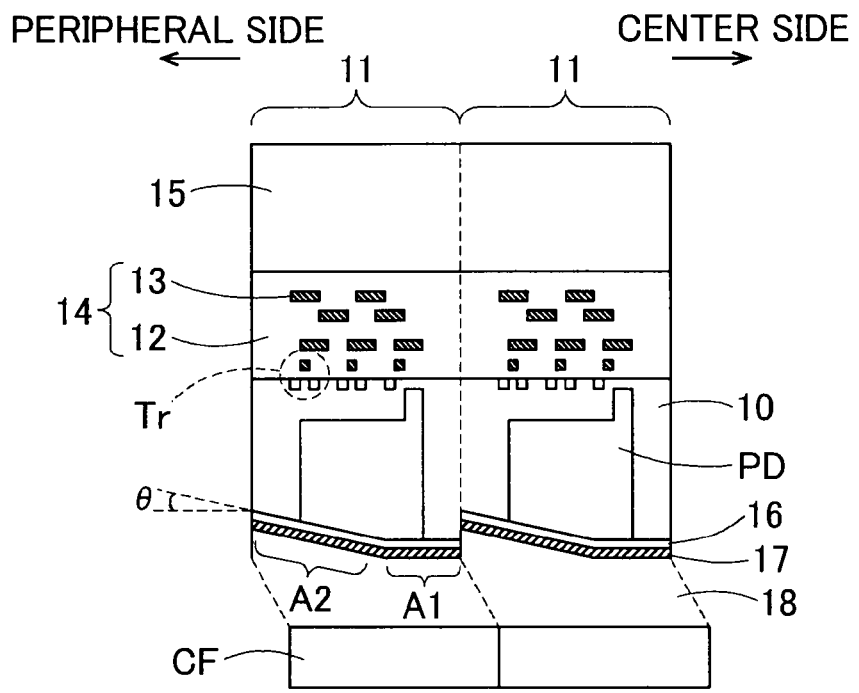
FIG. 1 is a diagram schematically showing the construction of a solid-state image pickup device in an embodiment of the present invention.

FIG. 1 shows a longitudinal sectional view of a solid-state image pickup device related to an embodiment of the present invention. The solid-state image pickup device related to this embodiment is a back side radiation type CMOS solid-state image pickup device.

In this solid-state image pickup device, upon a substrate 10, which is, for example, a silicon semiconductor substrate, there are formed in a matrix manner a plurality of unit pixels 11, each having a photodiode PD and a plurality of MOS transistors Tr, which become means of performing the reading-out, amplification, resetting and the like of a signal charge of this photodiode PD.

Figure 2:
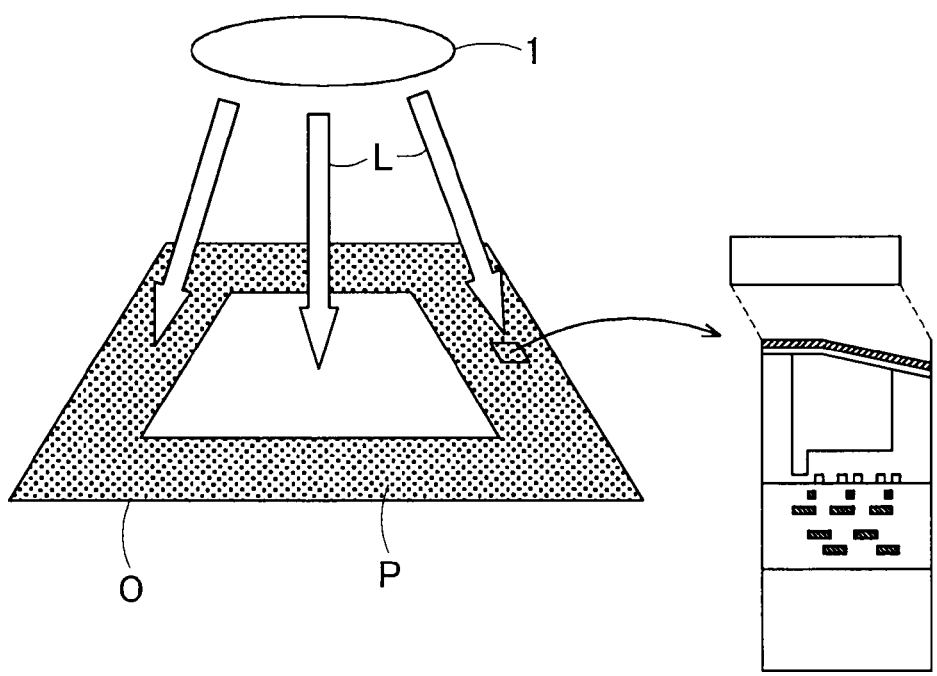
FIG. 2 is a diagram showing the pixel region of a solid-state image pickup device in this embodiment.

As shown in FIG. 2, a description will be given here of pixels in a peripheral part P of a pixel region O in which the incident angle of light L from an image optics system 1 is large.

Upon the front surface (second surface) side of the substrate 10, there is formed a multilayer interconnect layer 14 having multilayer interconnects 13 via interlayer dielectrics 12. Furthermore, upon the interconnect layer 14, a supporting substrate 15, which is, for example, a silicon substrate, is stuck in order to maintain the mechanical strength of the solid-state image pickup device.

The back surface (first surface) side of the substrate 10 (photodiode PD) has a region A1 parallel to the front surface (second surface) of the substrate 10 and a region A2 forming an angle θ to the front surface of the substrate 10. The regions A1 and A2 are formed in such a manner that the region A1 is on the center side of the pixel region and the region A2 is on the peripheral side of the pixel region.

A shielding layer 16 is formed in a back surface portion of the substrate 10, and upon the back surface of the shielding layer 16, there are formed an antireflection coating 17, which is made of, for example, a silicon oxide film, and a transparent planarization film 18. The shielding layer 16 is a p+ impurity layer. The antireflection coating 17 may be a multilayer film formed from silicon oxide films or silicon nitride films. It is preferred that the transparent planarization film 18 be made of a transparent resin-like substance and have an exceedingly high transmittance.

The shielding layer 16 and the antireflection coating 17 have each a shape corresponding to the regions A1, A2. The front surface (the surface on the antireflection coating 17 side) of the transparent planarization film 18 has a shape corresponding to the antireflection coating 17.

A color filter CF is formed on the back surface side of the transparent planarization film 18. The color filter CF allows light of a specific wave length to pass, and three colors of, for example, R (red), G (green) and B (blue) constitute one set. The color filter CF corresponding to each pixel is provided so as to be shifted toward the center side of the pixel region.

Figure 3:
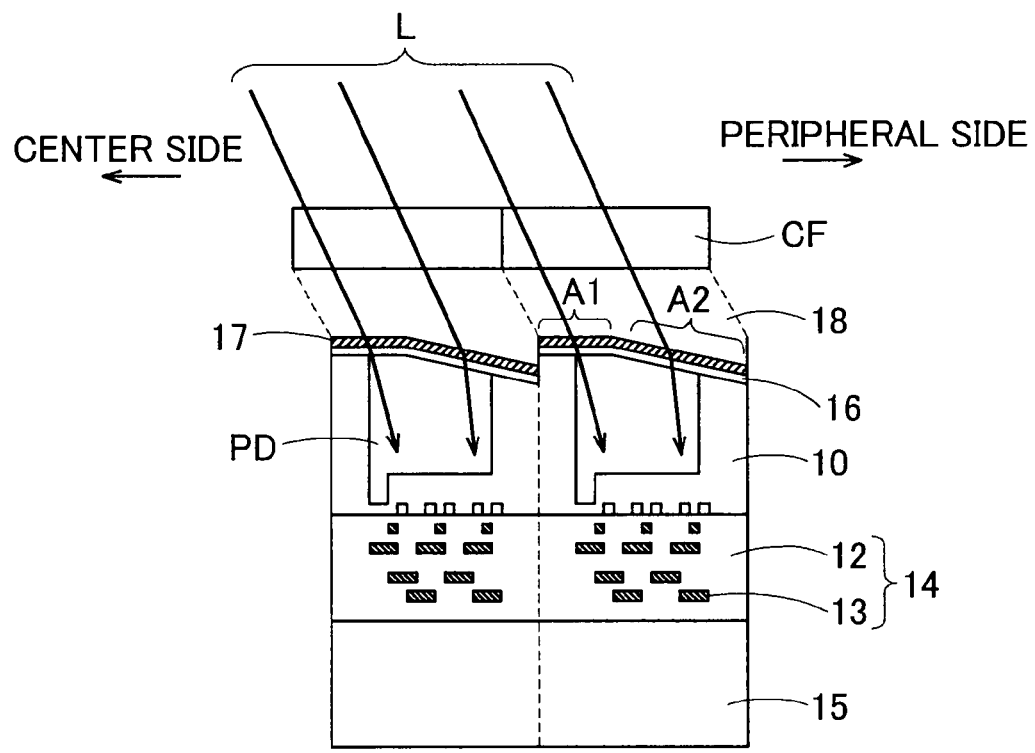
FIG. 3 is a diagram showing the refraction of incident light.

The incidence of oblique light on such a pixel will be described by using FIG. 3. For illustrative purposes, FIG. 3 shows the back surface side of the solid-state image pickup device in the upward direction in the figure. The values of refractive index described below are examples.

The refractive index of the color filter CF is approximately 1.6, the refractive index of the transparent planarization film 18 is approximately 1.5, and the refractive index of the antireflection coating (silicon oxide film) 17 is approximately 1.46. Because of small differences in the refractive index, the angles of refraction of oblique incident light L at these interfaces are small.

On the other hand, the refractive index of the substrate (silicon) 10 is approximately 3.97 for red light and approximately 5.94 for blue light. Because of great differences in the refractive index from the antireflection coating (silicon oxide film) 17, the refraction of the oblique incident light L at the interface between the substrate 10 and the antireflection coating 17 becomes large.

Furthermore, because the region A2 has an inclination which is such that the incident angle of light is larger than in the region A1, the oblique incident light L refracted at the interface between the substrate 10 and the antireflection coating 17 in the region A2 advances substantially perpendicularly to the front surface of the substrate 10 within the photodiode PD.

Figure 4:
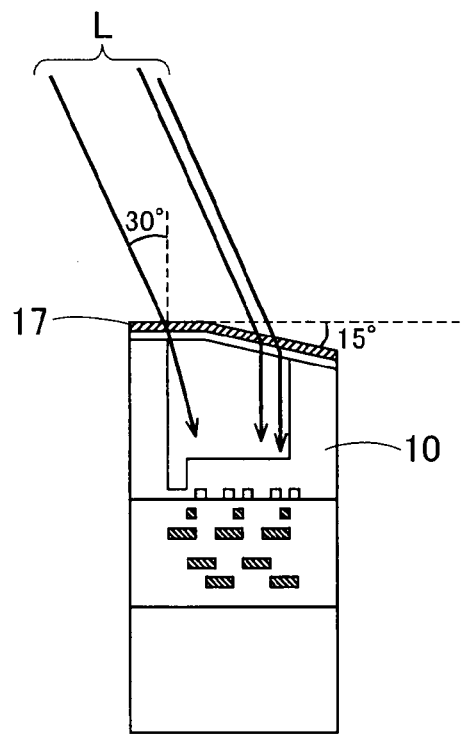
FIG. 4 is a diagram showing an example of the incident angle and refraction angle of light.

For example, as shown in FIG. 4, in a case where the region A2 has an inclination of 15° to the front surface of the substrate 10 and the incident angle of the light L in the region A1 is 30°, the entry angle of the light that is refracted at the interface between the substrate 10 and the antireflection coating (silicon oxide film) 17 in the region A2 and travels within the photodiode PD becomes approximately 0.1° to the perpendicular direction of the front surface of the substrate 10.

For this reason, it is possible to prevent the light traveling within the photodiode PD from entering an adjacent pixel and hence it is possible to suppress the occurrence of the mixing of colors. Moreover, because the color filter CF is provided so as to be shifted toward the center side of the pixel region, the effect of the mixing of colors is further improved.

With reference to FIGS. 5 to 9, a description will be given of a method of manufacturing such a solid-state image pickup device in which the back surface side of a photodiode PD has a flat surface parallel to the front surface of the substrate and a flat surface having an inclination to the front surface of the substrate.

Figure 5:
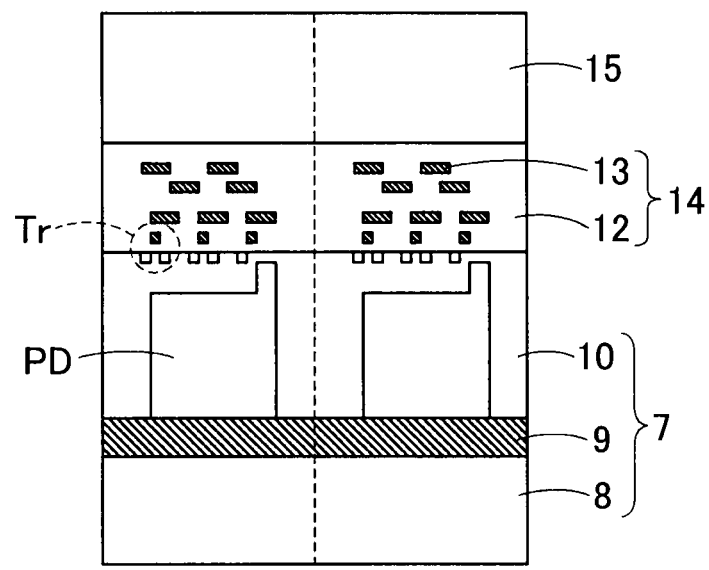
FIG. 5 is a sectional process drawing to explain the manufacturing method of a solid-state image pickup device in this embodiment.

As shown in FIG. 5, an SOI (silicon on insulator) substrate 7 in which a silicon layer 10 is formed on a silicon substrate 8 via a silicon oxide film 9 is prepared. And the ion implantation of the silicon layer 10 is performed, whereby an impurity layer, which becomes a photodiode PD, is formed. The impurity layer, which becomes the photodiode PD, is formed from a pn junction that consists of an n type region and a p type region.

Next, upon the silicon layer 10 are formed transistors Tr that perform the reading-out, amplification, resetting and the like of signal charges accumulated in the photodiode PD. A pixel region is formed by forming in a matrix manner unit pixels having a photodiode PD and a transistor Tr.

Subsequently, a multilayer interconnect layer 14 having multilayer interconnects 13 via interlayer dielectrics 12 is formed on the silicon layer 10. The transistors Tr and the multilayer interconnect layer 14 can be formed by using the publicly known CMOS process.

After that, the front surfaces of the interlayer dielectrics 12 of the multilayer interconnect layer 14 are planarized and a supporting substrate 15 is stuck.

Figure 6:
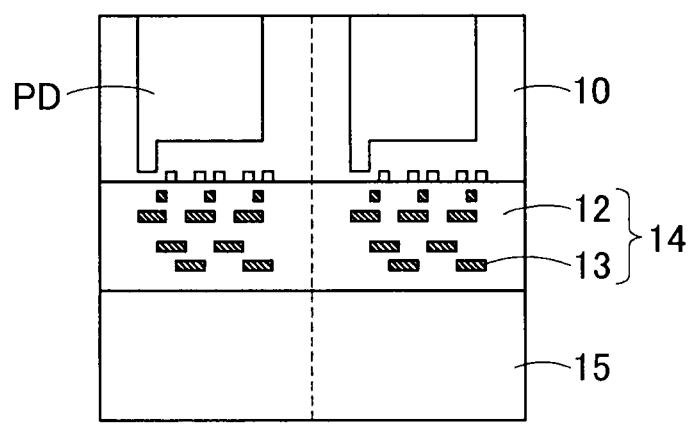
FIG. 6 is a sectional process drawing of a step after the step of FIG. 5.

As shown in FIG. 6, the substrate is turned upside down, the silicon substrate 8 is removed by mechanical grinding and wet etching having selectivity for a silicon oxide film, and the silicon oxide film 9 is removed by wet etching, whereby the back surface of the silicon layer 10 is exposed.

Figure 7:
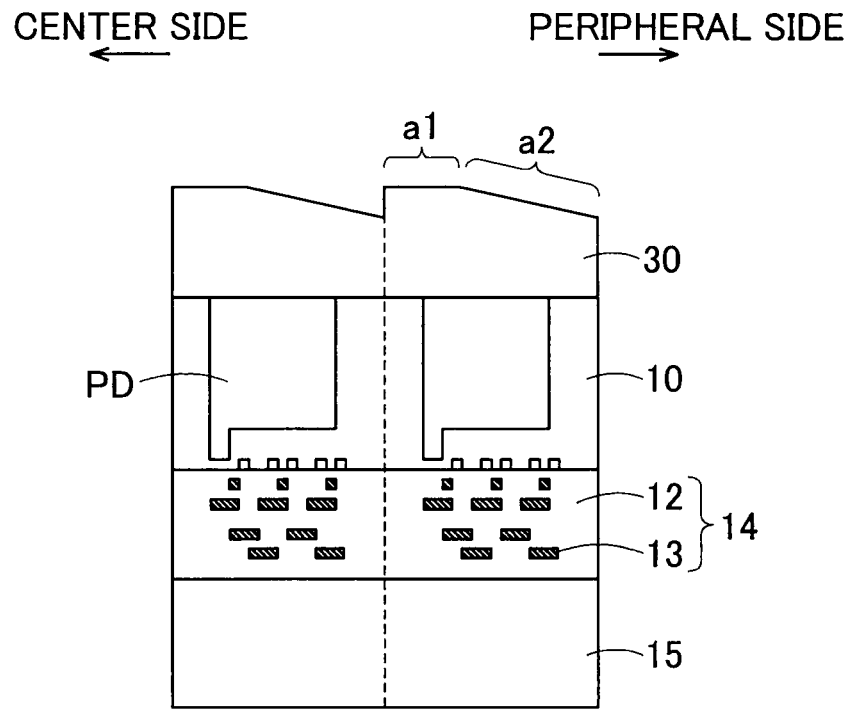
FIG. 7 is a sectional process drawing of a step after the step of FIG. 6.

As shown in FIG. 7, a resist 30 is formed on the back surface of the silicon layer 10, a pattern is exposed by using a gray scale mask, and a resist pattern having a region a1 parallel to the back surface of the silicon layer 10 and a region a2 having an inclination is formed for each unit pixel. The regions a1 and a2 are formed in such a manner that the region a1 is on the center side of the pixel region and the region a2 is on the peripheral side of the pixel region.

The gray scale mask is an area gradation type mask in which many micro aperture patterns are arranged and the transmittance of light is adjusted by the area ratio of aperture portions to light shading portions.

Figure 8:
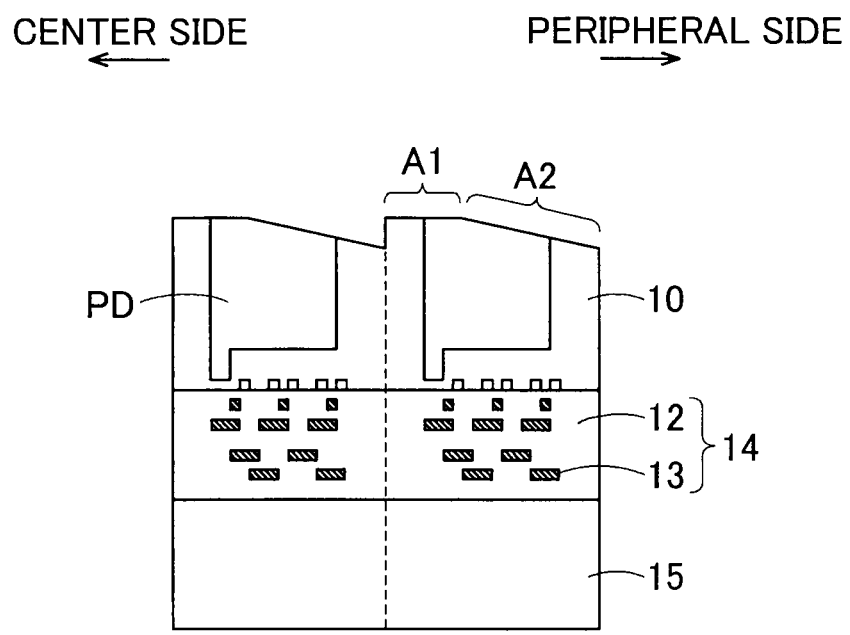
FIG. 8 is a sectional process drawing of a step after the step of FIG. 7.

As shown in FIG. 8, the resist shape is transferred to the silicon layer 10 by anisotropic dry etching. As a result of this, upon the back surface of the photodiode PD, there are formed a region A1 parallel to the front surface of the silicon layer 10 and a region A2 having an inclination to the front surface of the silicon layer 10.

Figure 9:
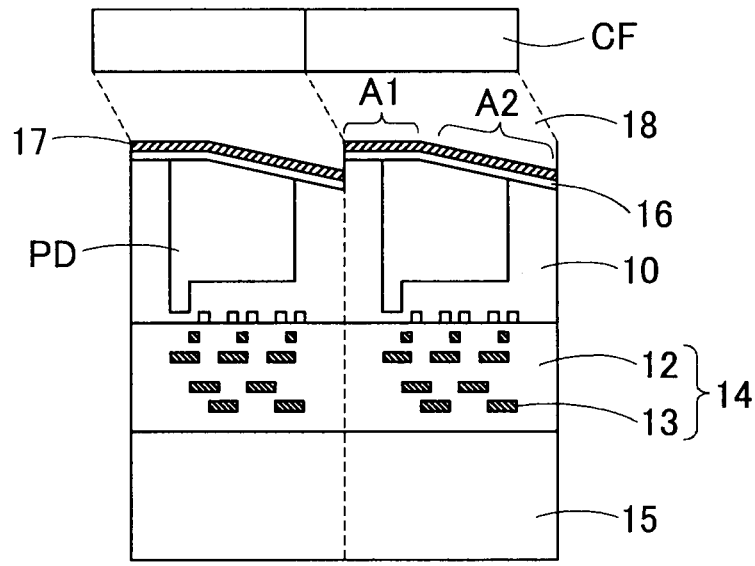
FIG. 9 is a sectional process drawing of a step after the step of FIG. 8.

As shown in FIG. 9, a shielding layer 16 is formed by implanting a p type impurity. And upon the back surface (surface of incidence) of the silicon layer 10, there are formed a silicon oxide film 17, a transparent planarization film 18 and a color filter CF. The color filter CF is formed so as to be shifted toward the center side of the pixel region area. The silicon oxide film 17 is intended for preventing the reflection of incident light and may have a multilayer structure with a silicon nitride film.

In a solid-state image pickup device thus manufactured, oblique incident light travels substantially perpendicularly to the front surface of the silicon layer 10 due to the refraction at the interface between the silicon oxide film 17 and the silicon layer 10 in the region A2. Therefore, the penetration of the light into an adjacent pixel is prevented and the occurrence of the mixing of colors can be suppressed.

As described above, the back side radiation type solid-state image pickup device according to this embodiment is such that the photodiode PD has, on the back surface, the region A1 parallel to the front surface of the substrate (silicon layer) 10 and the inclined region A2 that provides a larger incident angle of light than the region A1, whereby the mixing of colors is prevented by suppressing the penetration of light into an adjacent pixel, the sensitivity is improved, and high-quality images can be obtained.

In the solid-state image pickup device according to this embodiment, microlenses may be formed on the color filter CF. However, when the traveling direction of incident light can be sufficiently controlled by the inclined region A2, high-quality images can be obtained without microlenses.

When microlenses are not provided, air layers that are necessary on the microlenses (for getting the difference of refractive indexes to refract the light) become unnecessary, and it is possible to miniaturize the solid-state image pickup device and to increase the strength thereof.

Figure 10:
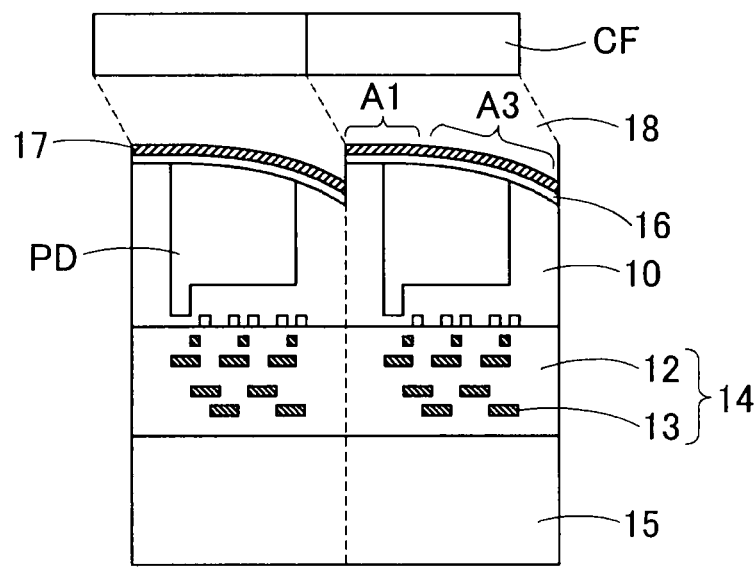
FIG. 10 is a diagram schematically showing the construction of a solid-state image pickup device in a modification.

In the above-described embodiment, the back surface of the photodiode PD has a flat surface parallel to the front surface of the substrate 10 and a flat surface having an inclination. However, as shown in FIG. 10, the back surface of the photodiode PD may have a flat surface A1 parallel to the front surface of the substrate 10 and a convex curved surface A3.

Because light refracted at the interface between the photodiode PD and an antireflection coating 17 in the curved surface A3 travels substantially perpendicularly to the front surface of the substrate 10, the penetration of the light into an adjacent pixel is prevented and the occurrence of the mixing of colors can be suppressed.

Figure 11:
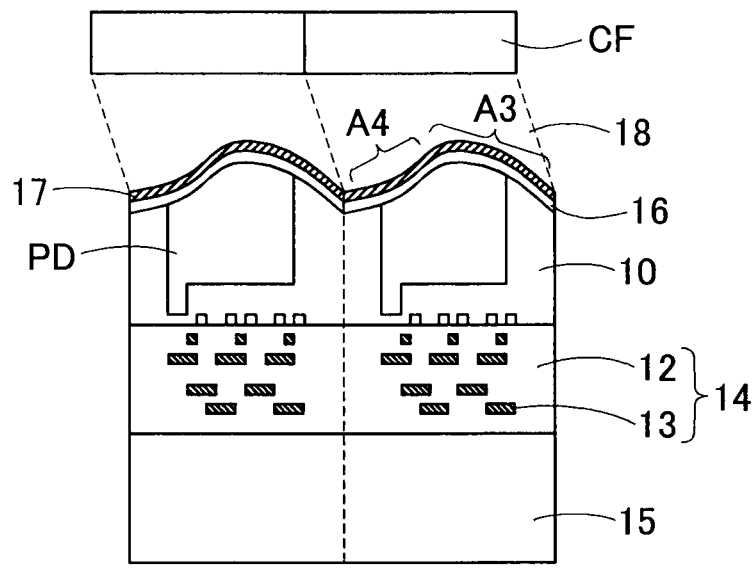
FIG. 11 is a diagram schematically showing the construction of a solid-state image pickup device in a modification.

As shown in FIG. 11, the back surface of the photodiode PD may have a concave curved surface A4 and a convex curved surface A3. The efficiency of light collection to the center part of a pixel can be further increased by forming the region parallel to the front surface of the substrate 10 in the above-described embodiment as the concave curved surface A4.

Figure 12:
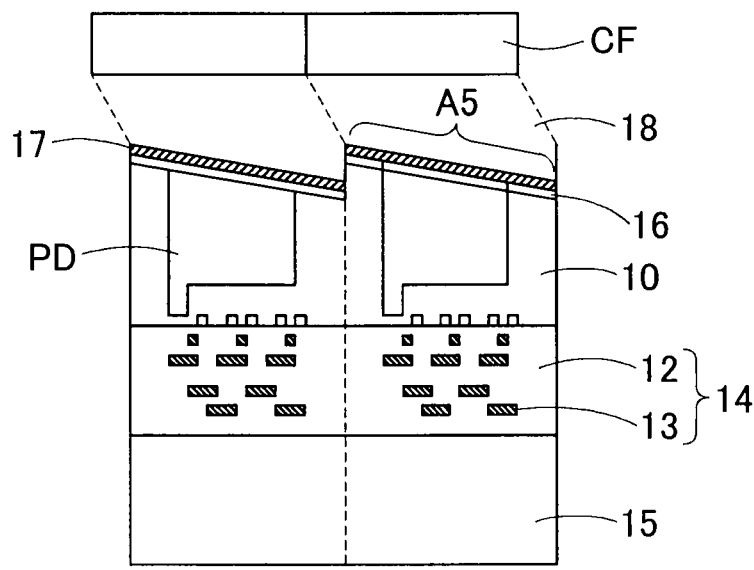
FIG. 12 is a diagram schematically showing the construction of a solid-state image pickup device in a modification.

As shown in FIG. 12, the back surface of the photodiode PD may have only an inclined surface A5 without having a flat surface parallel to the front surface of the substrate 10. Also in this construction, as with the above-described embodiment, the penetration of the light into an adjacent pixel is prevented and the occurrence of the mixing of colors can be suppressed.

In the same manner as with the above-described embodiment, the back surface shape of the photodiodes PD shown in FIGS. 10 to 12 can be formed by the formation of a resist pattern using a gray scale mask and the pattern transfer by anisotropic dry etching.

Figure 13:
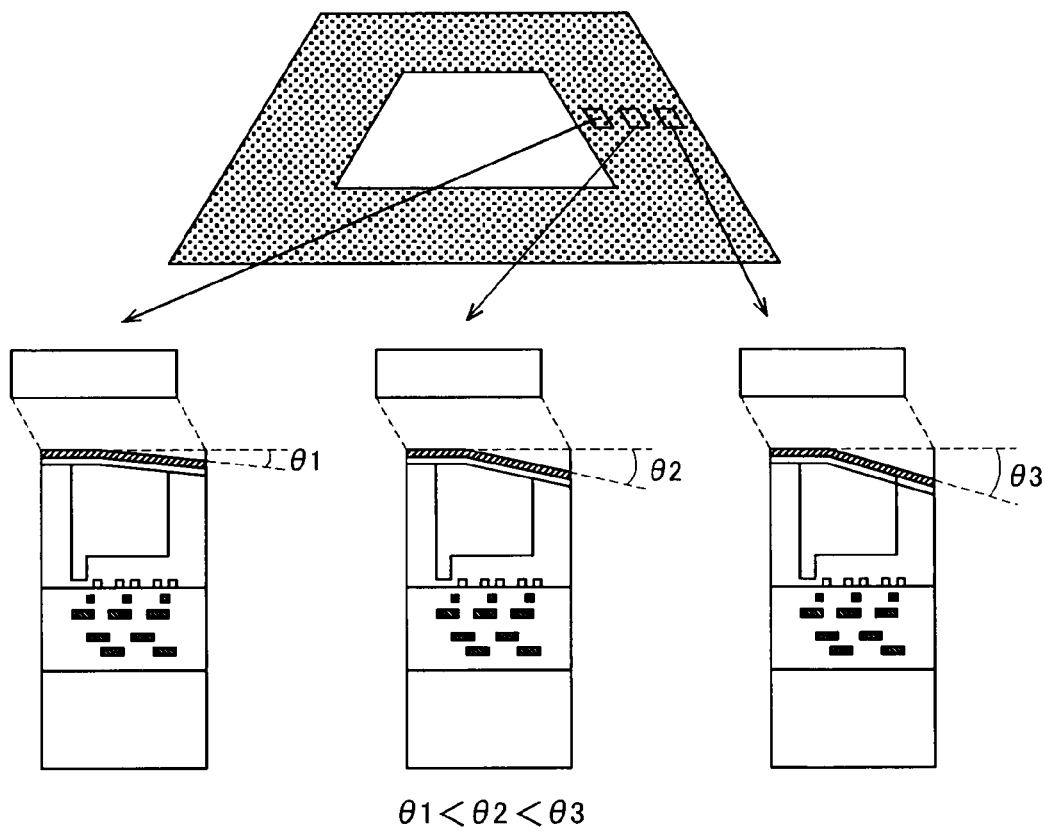
FIG. 13 is a diagram schematically showing the construction of a solid-state image pickup device in a modification.

The region A2 shown in FIG. 1 and the inclined surface A5 shown in FIG. 12 may be formed in such a manner that as shown in FIG. 13, the longer the distance from the center part of a pixel region, the larger the inclination angle $\theta$. This is because the longer the distance from the center part, the larger the incident angle of light to the flat surface of the substrate. As a result of this, the inclination angle becomes preferred for each pixel, the efficiency of light collection to the center part of a pixel is further increased, and higher-quality images can be obtained.

Figure 14:
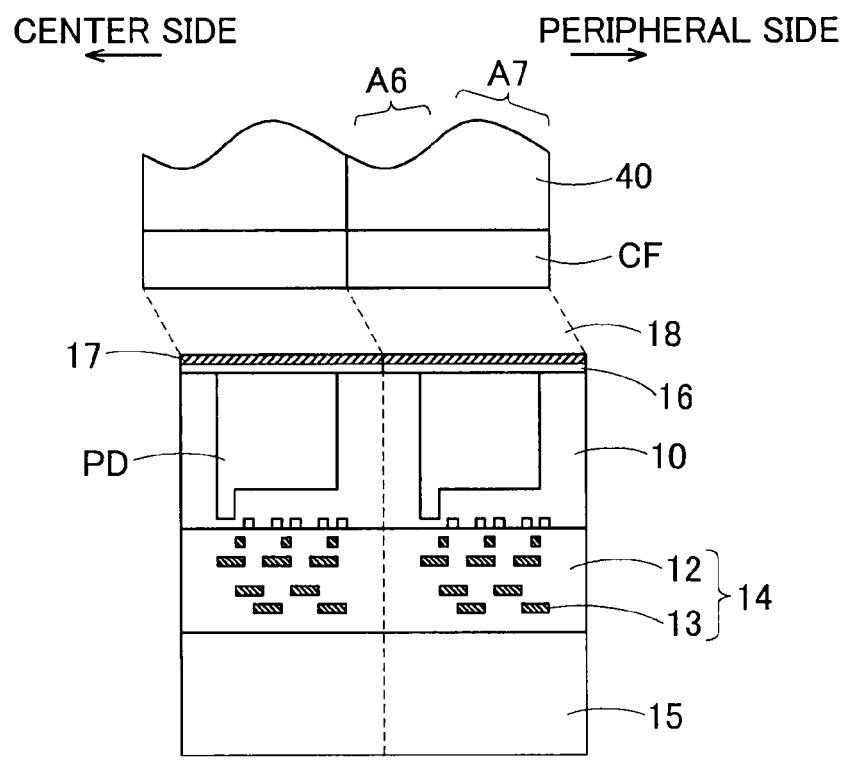
FIG. 14 is a diagram schematically showing the construction of a solid-state image pickup device in a modification.

Furthermore, as shown in FIG. 14, it is also possible to adopt a modification in which the back surface shape of the photodiode PD is flat and upon the back surface of the color filter CF is provided a light collecting part 40 including a concave curved surface A6 and a convex curved surface A7.

The light collecting part 40 is made of transparent resin and can be processed to have such a shape by using, for example, the imprint method. The concave curved surface A6 and the convex curved surface A7 are formed in such a manner that the concave curved surface A6 is on the center side of the pixel region and the convex curved surface A7 is on the peripheral side of the pixel region.

Because the light collecting part 40 has a high efficiency of collection of incident light to the center part of a pixel, the penetration of the light into an adjacent pixel is prevented and the occurrence of the mixing of colors can be suppressed.

Although in the above-described embodiment the solid-state image pickup device is fabricated by using an SOI substrate, a bulk single-crystal silicon substrate may also be used. In this case, mechanical grinding and CMP (chemical-mechanical polishing) are used in the step of thinning the back surface side (the side opposite to the surface on which a photodiode and a multilayer interconnect layer are formed) of the silicon substrate to a thickness that enables light to be taken in. The thickness of the silicon substrate to be removed is several hundred micrometers and it takes time to remove this with CMP alone. Therefore, the silicon substrate is first roughly ground by mechanical grinding and then polished to a desired thickness by CMP. (The resistivity selective etching technique may also be used to remove only the silicon substrate remaining the photodiode layer.) The film thickness of a thinned layer of the silicon substrate may differ depending on the wavelength of the light to be measured.

A metal antireflection coating using a metal interconnect layer may also be provided in a boundary part of color filters CF that are adjacent to each other. The metal antireflection coating can be formed from a material that reflects visible light, such as titanium.

In the above-described embodiment, exposure is performed by using a gray scale mask in preparing a resist pattern (FIG. 7). However, it is also possible to adopt a moving-mask exposure method, which is a technique that involves controlling the exposure energy distribution to the resist surface by moving a mask during exposure and processing a three-dimensional structure having free curved surfaces. Also, a resist pattern may be processed by the nanoimprint method.

What is claimed is:

1. A solid-state image pickup device, comprising:
   a substrate having a first surface and a second surface opposite to the first surface, and including:
   a photoelectric conversion element that is formed in a first surface side of the substrate and converts light incident from the first surface of the substrate into a signal charge;
   a transistor that is formed on a second surface side of the substrate and reads out the signal charge from the photoelectric conversion element;
   a supporting substrate attached to the second surface of the substrate; and
   an antireflection coating formed on the first surface of the substrate,
   wherein a surface of the photoelectric conversion element includes an inclined surface portion forming a prescribed angle to the second surface of the substrate, and
   the first surface of the substrate includes a flat surface parallel to the second surface on a center side of a pixel region where the photoelectric conversion element is arranged in a matrix manner and includes the inclined surface on a peripheral side opposite to the center side.

2. A solid-state image pickup device, comprising:
   a substrate having a first surface and a second surface opposite to the first surface, and including:
   a photoelectric conversion element that is formed in a first surface side of the substrate and converts light incident from the first surface of the substrate into a signal charge;
   a transistor that is formed on a second surface side of the substrate and reads out the signal charge from the photoelectric conversion element;
   a supporting substrate attached to the second surface of the substrate; and
   an antireflection coating formed on the first surface of the substrate,
   wherein a surface of the photoelectric conversion element includes an inclined surface portion forming a prescribed angle to the second surface of the substrate,
   a normal line of the inclined surface is inclined with respect to a normal line of the second surface toward the peripheral side of the pixel region, and
   an angle formed between the normal line of the inclined surface corresponding to the photoelectric conversion element, which is formed in a peripheral part of the pixel region, and the normal line of the second surface, is larger than an angle formed between the normal line of the inclined surface corresponding to the photoelectric conversion element, which is formed in a center part of the pixel region, and the normal line of the second surface.

3. A solid-state image pickup device, comprising,
   a substrate having a first surface and a second surface opposite to the first surface, and including:
   a photoelectric conversion element that is formed in a first surface side of the substrate and converts light incident from the first surface of the substrate into a signal charge;
   a transistor that is formed on a second surface side of the substrate and reads out the signal charge from the photoelectric conversion element;
   a supporting substrate attached to the second surface of the substrate; and
   an antireflection coating formed on the first surface of the substrate,
   wherein a surface of the photoelectric conversion element includes a curved surface portion,
   the first surface of the substrate includes a flat surface parallel to the second surface, and
   the first surface of the substrate includes the flat surface on the center side where the photoelectric conversion element is arranged in a matrix manner, and includes the curved surface on the peripheral side opposite to the center side.

4. The solid-state image pickup device according to claim 3, wherein the curved surface is a convex curved surface that is convex in a direction opposite to the second surface.

5. A solid-state image pickup device, comprising:
   a substrate having a first surface and a second surface opposite to the first surface, and including:
   a photoelectric conversion element that is formed in a first surface side of the substrate and converts light incident from the first surface of the substrate into a signal charge;
   a transistor that is formed on a second surface side of the substrate and reads out the signal charge from the photoelectric conversion element;
   a supporting substrate attached to the second surface of the substrate; and
   an antireflection coating formed on the first surface of the substrate,
   wherein a surface of the photoelectric conversion element includes a curved surface portion or an inclined surface portion forming a prescribed angle to the second surface of the substrate,
   the first surface of the substrate includes a convex curved surface that is convex in a direction opposite to the second surface and a concave curved surface that is concave, and
   the first surface of the substrate includes the concave curved surface on the center side of the pixel region where the photoelectric conversion element is arranged in a matrix manner, and includes the convex curved surface on the peripheral side opposite to the center side.

6. A solid-state image pickup device, comprising:
   a substrate having a first surface and a second surface opposite to the first surface, and including:
   a photoelectric conversion element that is formed in a first surface side of the substrate and converts light incident from the first surface of the substrate into a signal charge;
   a transistor that is formed on a second surface side of the substrate and reads out the signal charge from the photoelectric conversion element;
   a supporting substrate attached to the second surface of the substrate; and
   an antireflection coating formed on the first surface of the substrate,
   wherein a surface of the photoelectric conversion element includes a curved surface portion or an inclined surface portion forming a prescribed angle to the second surface of the substrate, and
   the first surface consists of an inclined surface forming a prescribed angle to the second surface and the normal line of the inclined surface is inclined with respect to the normal line of the second surface toward the peripheral side opposite to the center side of the pixel region where the photoelectric conversion element is arranged in a matrix manner.

7. The solid-state image pickup device according to claim 6, wherein an angle formed between the normal line of the inclined surface corresponding to the photoelectric conversion element, which is formed in a peripheral part of the pixel region, and the normal line of the second surface, is larger than an angle formed between the normal line of the inclined surface corresponding to the photoelectric conversion element, which is formed in a center part of the pixel region, and the normal line of the second surface.

8. A solid-state image pickup device, comprising:
a substrate having a first surface and a second surface opposite to the first surface, and including:
a photoelectric conversion element that is formed in a first surface side of the substrate and converts light incident from the first surface of the substrate into a signal charge;
a transistor that is formed on a second surface side of the substrate and reads out the signal charge from the photoelectric conversion element;
a supporting substrate attached to the second surface of the substrate;
an antireflection coating formed on the first surface of the substrate;
a transparent planarization film formed on the antireflection coating; and
a color filter formed on the transparent planarization film,
wherein a surface of the photoelectric conversion element includes a curved surface portion or an inclined surface portion forming a prescribed angle to the second surface of the substrate, and
the color filter is formed so as to be shifted by a prescribed distance toward the center side of the pixel region where the photoelectric conversion element is arranged in a matrix manner with respect to the corresponding photoelectric conversion element.

9. The solid-state image pickup device according to claim 8, wherein the curved surface is a convex curved surface that is convex in a direction opposite to the second surface.

10. The solid-state image pickup device according to claim 9, further comprising a microlens formed on the color filter.

11. The solid-state image pickup device according to claim 8, wherein the normal line of the inclined surface is inclined with respect to the normal line of the second surface toward the peripheral side opposite to the center side of the pixel region where the photoelectric conversion element is arranged in a matrix manner.

12. The solid-state image pickup device according to claim 11, further comprising a microlens formed on the color filter.

13. A solid-state image pickup device, comprising:
a substrate having a first surface and a second surface opposite to the first surface, and including:
a photoelectric conversion element that is formed in a first surface side of the substrate and converts light incident from the first surface of the substrate into a signal charge;
a transistor that is formed on a second surface side of the substrate and reads out the signal charge from the photoelectric conversion element;
a supporting substrate attached to the second surface of the substrate; and
an antireflection coating formed on the first surface of the substrate,
wherein a surface of the photoelectric conversion element includes an inclined surface portion forming a prescribed angle to the second surface of the substrate, and
an angle is formed between the normal line of the inclined surface corresponding to the photoelectric conversion element and the normal line of the second surface for pixels in the peripheral part of the pixel region, and the angle increases as pixels are located farther from a center part of the pixel region.

* * * * *